United States Patent
Cho

(10) Patent No.: US 8,339,889 B2
(45) Date of Patent: Dec. 25, 2012

(54) SEMICONDUCTOR MEMORY DEVICE

(75) Inventor: Ji-Ho Cho, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 348 days.

(21) Appl. No.: 12/766,974

(22) Filed: Apr. 26, 2010

(65) Prior Publication Data

US 2010/0278001 A1 Nov. 4, 2010

(30) Foreign Application Priority Data

Apr. 30, 2009 (KR) .................. 10-2009-0038355

(51) Int. Cl.
*G11C 5/14* (2006.01)

(52) U.S. Cl. ............ 365/226; 365/189.09; 365/200; 365/227; 365/228; 365/229

(58) Field of Classification Search .......... 365/189.09, 365/200, 226, 227, 228, 229

See application file for complete search history.

(56) References Cited

U.S. PATENT DOCUMENTS

| 6,429,725 | B1 | 8/2002 | Tanzawa et al. |
| 6,826,087 | B2 | 11/2004 | Azuma |
| 2004/0027866 | A1* | 2/2004 | Pekny ............ 365/189.09 |
| 2006/0202668 | A1* | 9/2006 | Tran et al. ............ 323/215 |
| 2010/0171544 | A1* | 7/2010 | Seo ............ 327/536 |
| 2010/0295835 | A1* | 11/2010 | Kim et al. ............ 345/211 |

FOREIGN PATENT DOCUMENTS

| KR | 1020020047521 A | 6/2002 |
| KR | 1020040038529 A | 5/2004 |

* cited by examiner

*Primary Examiner* — Ly D Pham
(74) *Attorney, Agent, or Firm* — Volentine & Whitt, PLLC

(57) ABSTRACT

A semiconductor memory device includes a memory core; a charge pump circuit providing a high voltage to the memory core; and a charge pump control circuit operating the charge pump circuit by a standby mode and measuring an operation time value of the standby mode. The charge pump control circuit controls the standby mode of the charge pump circuit using the time value.

15 Claims, 5 Drawing Sheets

SEMICONDUCTOR MEMORY DEVICE

CROSS-REFERENCE TO RELATED APPLICATIONS

This U.S. non-provisional patent application claims priority under 35 U.S.C. §119 of Korean Patent Application No. 10-2009-0038355 filed on Apr. 30, 2009, the subject matter of which is hereby incorporated by reference.

BACKGROUND

The present disclosure herein relates to a semiconductor device, and more particularly, to a semiconductor memory device.

Semiconductor memory devices are essential components in modern digital logic systems such as computers, consumer electronics, and communication devices. Many applications are enabled by a microprocessor or digital controller communicating data with one or more semiconductor memory devices. As digital logic systems are provided to the consumer with ever increasing functionally, reduced power consumption and shrinking physical size, it is necessary to constantly improve the design and manufacturing techniques that yield semiconductor memory devices. Generally speaking, smaller and more densely integrated semiconductor memory devices are demanded that operate at higher speed with lower power consumption.

Semiconductor memory devices may be divided into volatile and nonvolatile semiconductor memory devices. In volatile semiconductor memory devices, data (i.e., logic information) may be stored by setting up or establishing a particular logic state among a set of possible logic states. For example, in a static random access memory (SRAM), a logic state may be set up using a bistable flip-flop element. In a dynamic random access memory (DRAM), a defined quantity of electrical charge is placed on a capacitor element. So long as power is applied to volatile memory devices, stored data may be accessed. Yet, volatile memory devices lose stored data in the absence of applied power.

Nonvolatile semiconductor memory devices include such conventionally understood devise as the MROM, PROM, EPROM, EEPROM, for example. In contrast to volatile memory devices, nonvolatile memory devices are able to retain stored data in absence of applied power. The data state of a nonvolatile semiconductor memory device may be permanent or reprogrammable according to its design and manufacturing techniques. Nonvolatile semiconductor memory devices are used to store program code and/or user (or payload) data across a wide range of applications. Specific memory structures including some additional logic circuits have been developed to optimize the performance for certain application-oriented memory devices.

Some nonvolatile semiconductor memory devices, such as the MROM, PROM and EPROM cannot easily perform erase or write operations. That is, data stored in these specific memory devices may not be readily changed within an incorporating system in response to general application/user requirements. Rather, a cumbersome and externally applied programming apparatus is typically required to alter the data in these memory devices. In contrast, erase and program operations may be electrically performed in the EEPROM. Accordingly, the EEPROM has been widely adopted for use in system programming applications requiring continuous data update or auxiliary memory systems.

SUMMARY OF THE INVENTIVE CONCEPT

Embodiments of the inventive concept provide a semiconductor memory device. The semiconductor memory device may include a memory core; a charge pump circuit providing a high voltage to the memory core; and a charge pump control circuit operating the charge pump circuit by a standby mode and measuring an operation time value of the standby mode. The charge pump control circuit controls the standby mode of the charge pump circuit using the time value.

One embodiment of the inventive concept provides a semiconductor memory device comprising; a memory core, a charge pump circuit configured to provide a high voltage signal to the memory core, and a charge pump control circuit configured to control operation of the charge pump circuit during a standby mode in relation to a default time value defining a time period for the standby mode in a normal mode of operation, and during the standby mode in relation to a time value different from the default time value defining a different time period in a test mode of operation.

In one related aspect, the charge pump control circuit may comprise; a pump controller configured to generate a start signal when the charge pump circuit is operating in the standby mode, a comparator configured to generate an end signal when the high voltage signal falls below a level of a reference voltage during the standby mode, and a timer configured to measure the default time value for the standby mode during the normal mode, and the different time value for the standby mode during the test mode in accordance with the start signal and the end signal.

In another related aspect, the reference voltage may be greater than a level of a standby voltage used to maintain the level of the high voltage signal during the standby mode.

In yet another related aspect, the memory core may comprise; a memory cell array configured to store the default time value, a read/write circuit configured to read the default time value from the memory cell array, and a trim circuit configured to provide the default time.

BRIEF DESCRIPTION OF THE DRAWINGS

The accompanying drawings are included to provide a further understanding of the inventive concept and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Certain embodiments of the inventive concept will now be described in some additional detail with reference to the accompanying drawings. The embodiments of the inventive concept may, however, be embodied in different forms and should not be constructed as being limited to only the illustrated embodiments. Rather, the embodiments are presented as teaching examples. Throughout the written description and drawings, like numbers and labels refer to like or similar elements.

Figure (FIG.) 1 is a block diagram of a semiconductor memory device in accordance with an embodiment of the inventive concept.

Figure 1:
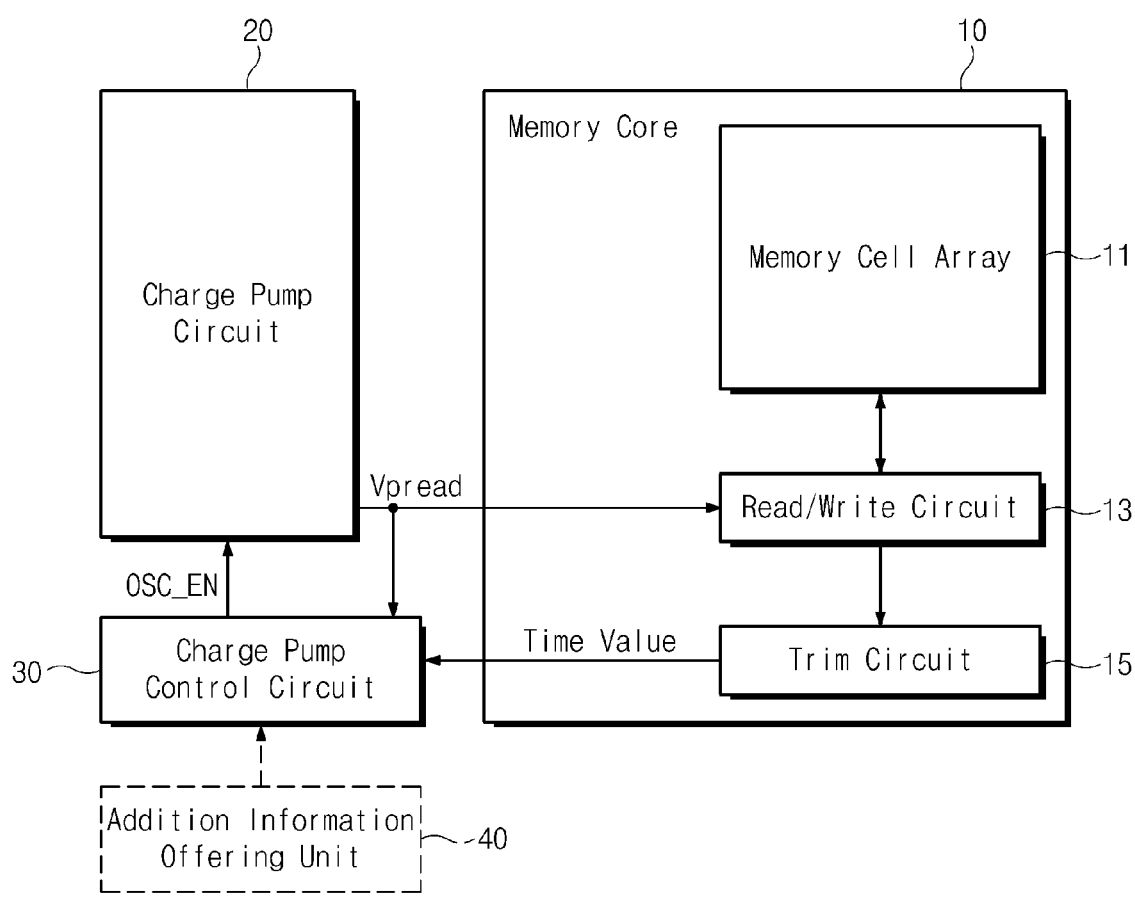
FIG. 1 is a block diagram of a semiconductor memory device in accordance with an embodiment of the inventive concept.

Referring to FIG. 1, a semiconductor memory device comprises in relevant portion a memory core 10, a charge pump circuit 20 and a charge pump control circuit 30. The semiconductor memory device may further comprise an additional information offering unit 40.

In the illustrated embodiment, the memory core 10 is shown including a memory cell array 11, a read/write circuit 13 and a trim circuit 15.

As is conventionally understood, the memory cell array 11 includes a plurality of memory cells arranged at the respective intersection of a plurality of rows (i.e., word lines) and a plurality of columns (i.e., bit lines). The memory cell array 11 includes a trim information area (not illustrated). Trim information (TI) (or E-Fuse) is stored in the trim information area. The trim information (TI) includes, for example, information controlling (defining) certain operating periods for various sections of memory cells in the memory cell array 11. These operating periods are critical to the proper execution of program (write), erase and read operations. The trim information (TI) may also include certain voltage control information defining various control voltages within the semiconductor memory device, as well as information necessary to select an input/output structure for the semiconductor memory device.

The read/write circuit 13 is controlled by a control circuit (not illustrated) and performs read/write operations. The read/write operations generally require the application of high voltages within the memory cell array 11. The control circuit, although not illustrated in the drawings, is conventionally understood and controls the overall operation of the semiconductor memory device.

The trim circuit 15 is also controlled by the control circuit and receives trim information read from the trim information area of the memory cell array 11. For example, the trim circuit 15 provides pump control information to charge pump control circuit 30. The trim circuit 15 may also provide voltage control information to related circuit(s) generating required voltages.

The charge pump circuit 20 functions in an active operation or a standby operation in response to control signals received from the charge pump control circuit 30. In the active operation, the charge pump circuit 20 defines the level of a prescribed voltage using an active voltage. That is, the charge pump circuit 20 controls an active voltage so as to have a given voltage level. In the standby operation, the charge pump circuit 20 maintains the level of the high voltage using a standby voltage.

The standby operation may be further divided into an active mode in which the charge pump circuit 20 operates and standby mode. In the active mode, the charge pump circuit 20 performs a charge pumping operation until reaching an active voltage requiring a high voltage. In standby mode, the charge pump circuit 20 halts the charge pumping operation until a high voltage falls back under a defined standby voltage level. During the standby operation, the charge pump circuit 20 controls the high voltage such that it is maintained above the standby voltage level by alternately functioning in the active and standby modes.

In one embodiment of the inventive concept, the charge pump circuit 20 generates the requisite high voltage signal in response to a clock enable signal (OSC_EN) controlling the charge pumping operation. For convenience of description, it will be assumed that the requisite high voltage signal is a read voltage (Vpread) commonly used during a read operation applied to the memory cell array 11. The read voltage (Vpread) is generated by operation of the charge pump circuit 20 under the control of the charge pump control circuit 30 and is provide to the read/write circuit 13.

Thus, the charge pump control circuit 30 controls the charge pump circuit 20 using the clock enable signal (OSC_EN) to define the charge pumping operation.

In addition to operating in read, write (program) and erase modes, contemporary semiconductor memory devices must also facilitate various test modes. One or more test modes must generally be operative during the fabrication of the semiconductor memory device to ensure its proper operation.

As with other operations, test modes define a number of time periods during which selected control signals operate. Thus, certain time period(s) related to the standby mode may be defined (or measured) by controlling the operation of the charge pump control circuit 30.

During a test mode, the charge pump control circuit 30 controls the functionality of the charge pump circuit 20 in the standby mode such that the read voltage (Vpread) is maintained at a level defined by the active voltage.

The charge pump control circuit 30 determines the time period during which the charge pump circuit 20 operates in the standby mode. Thus, the time period may be expressed as a value measured from the beginning of the standby mode to the end of the standby mode. In one approach, the charge pump control circuit 30, during standby mode, detects a time at which the read voltage (Vpread) falls below a reference voltage (Vref) as the end of the standby mode.

One or more time period values may be stored in the trim information area (not illustrated) of the memory cell array 11.

The optionally provided additional information offering unit 40 may also be controlled by the control circuit (not shown). The additional information offering unit 40 provides additional information to the charge pump control circuit 30. The additional information may include, for example, power supply information and temperature information. The additional information may further include separate additional information to change the level of one or more voltage(s) used in the standby mode. Thus, the additional information offering unit 40 may include a voltage measuring circuit configured to measure a power supply voltage (Vcc) and/or a temperature sensor configured to measure the working temperature of the semiconductor memory device.

If additional information is provided to the charge pump control circuit 30, said "additional information" may be used to adjust or correct one or more time periods for operation modes and/or control signals defined by the charge pump control circuit 30 according to the additional information. For example, the charge pump control circuit 30 may increase/decrease the time period for the standby mode in response to the additional information.

That is, when the semiconductor memory device is powered-up, a default time period value stored in the trim information area may be provided to the charge pump control circuit 30 through the read/write circuit 13 and the trim circuit 15. In response to the default time period value, the charge pump control circuit 30 will initially control (define) the standby mode for the charge pump circuit 20. This default operation may be considered a "normal mode" of operation. In the illustrated example of FIG. 1, the charge pump control circuit 30 halts provision of the clock enable signal (OSC_EN) controlling charge pumping to the charge pump circuit 20 during the standby mode.

Figure 2:
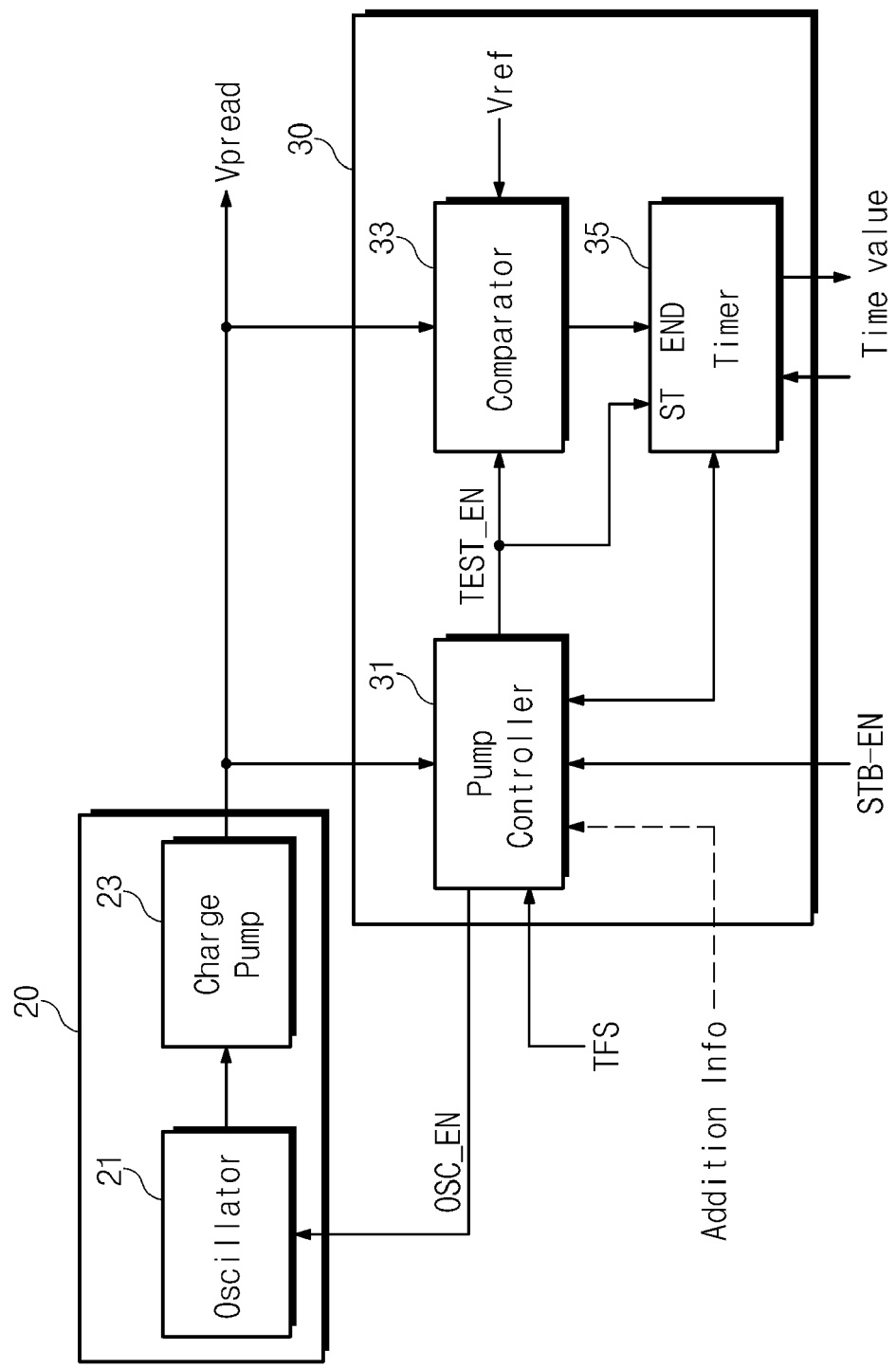
FIG. 2 is a block diagram further illustrating one possible structure for the charge pump circuit and charge pump control circuit of FIG. 1.

FIG. 2 is a block diagram further illustrating one possible structure for charge pump circuit 20 and charge pump control circuit 30 of FIG. 1.

Referring to FIG. 2, the charge pump circuit 20 comprises an oscillator 21 and a charge pump 23, and the charge pump control circuit 30 comprises a pump controller 31, a comparator 33 and a timer 35.

The oscillator 21 generates an oscillating signal in response to a clock enable signal (OSC_EN) in order to control the charge pumping. The charge pump 23 performs charge pumping as is conventionally understood in response to the oscillating signal. The output of the charge pump 23 in the illustrated embodiment is the read voltage (Vpread), although other high voltage signals may be similarly generated.

The pump controller 31 of the charge pump control circuit 30 operates in a test mode in response to a test flag signal (TFS) indicating entry into the test mode. The test flag signal may be provided by the control circuit. The pump controller 31 outputs the clock enable signal (OSC_EN) controlling the charge pumping. And the charge pump circuit 20 essentially operates in the active state when the clock enable signal (OSC_EN) is activated.

Thus, during the test mode, the pump controller 31 outputs the clock enable signal (OSC_EN) for a charge pumping such that the read voltage (Vpread) is maintained at a level defined by the active voltage. In certain embodiments, the pump controller 31 includes an active voltage comparator and maintains the read voltage (Vpread) at the level defined by the active voltage using the active voltage comparator.

When a standby mode enable signal (STB_EN) is applied to the pump controller 31 while the read voltage (Vpread) is being maintained at the level of the active voltage, the pump controller 31 halts (deactivates) the clock enable signal (OSC_EN). Also in response to the standby mode enable signal (STB_EN), the pump controller 31 provides a test enable signal (TEST_EN) to the comparator 33.

The comparator 33 operates in response to the test enable signal (TEST_EN) with respect to an externally provided reference voltage (Vref). The reference voltage (Vref) may be conventionally generated using a reference voltage generator. In certain embodiments of the inventive concept, the reference voltage (Vref) may be equal to or greater than the standby voltage.

The comparator 33 compares the read voltage (Vpread) provided by the charge pump 23 with the reference voltage (Vref). If the read voltage (Vpread) is less than the reference voltage (Vref), the comparator 33 outputs an end signal (END).

The timer 35 begins a count operation (i.e., a time measurement operation) in response to the test enable signal (TEST_EN). Thus, the test enable signal (TEST_EN) serves as a start signal (ST) for the timer 35. The timer 35 halts the count operation in response to the end signal (END). When the end signal (END) is applied, the timer 35 outputs a time value determined by the time period between the start signal (ST) and the end signal (END). For example, in one embodiment of the inventive concept, the timer 35 comprises a conventional oscillator (not illustrated) configured to implement the count operation.

As noted above, the pump controller 31 may correct or adjust a particular time value measured by the timer 35 in accordance with additional information applied by the additional information offering unit 40. Also as noted above, a default time value may be stored in the trim area of the memory cell array 11 of the semiconductor memory device.

When a semiconductor memory device is powered-up, the timer 35 receives the default time value from the trim circuit 15. At this time, the semiconductor memory device operates in the normal mode, as the timer 35 may include a latch storing the default time value.

The pump controller 31 provides the clock enable signal (OSC_EN) for a charge pumping to oscillator 21 under the control of the control circuit. When the charge pump circuit 20 operates in standby mode, the pump controller 31 halts provision of the clock enable signal (OSC_EN) for a charge pumping to the oscillator 21. The charge pump circuit 20 drives the timer 35 according to the default time value. When a time period indicated by the default time value has passed, the pump controller 31 provides the clock enable signal (OSC_EN) for a charge pumping to the oscillator 21 to halt operation in the standby mode.

The pump controller 31 functions in such a manner that the standby mode is defined in accordance with the default time value stored in the timer 35. However, in the test mode, a different time value controlling the standby mode may be obtained (i.e., a different time value requires by a non-normal mode of operation for the semiconductor memory device).

Thus, the pump controller 31 operates the charge pump circuit 20 in the standby mode in accordance with a time value as defined by certain modes of operation. A longer time value may be required during a test mode, for example, and the pump controller 31 according to an embodiment of the inventive concept may flexibly operate according to this longer time value during the test mode to effectively detect (e.g.,) the level of the standby voltage used to control the standby mode without necessarily using the longer time value during normal operation. This ability reduces overall current consumption during the standby mode of operation for the charge pump circuit 20.

Figure 3:
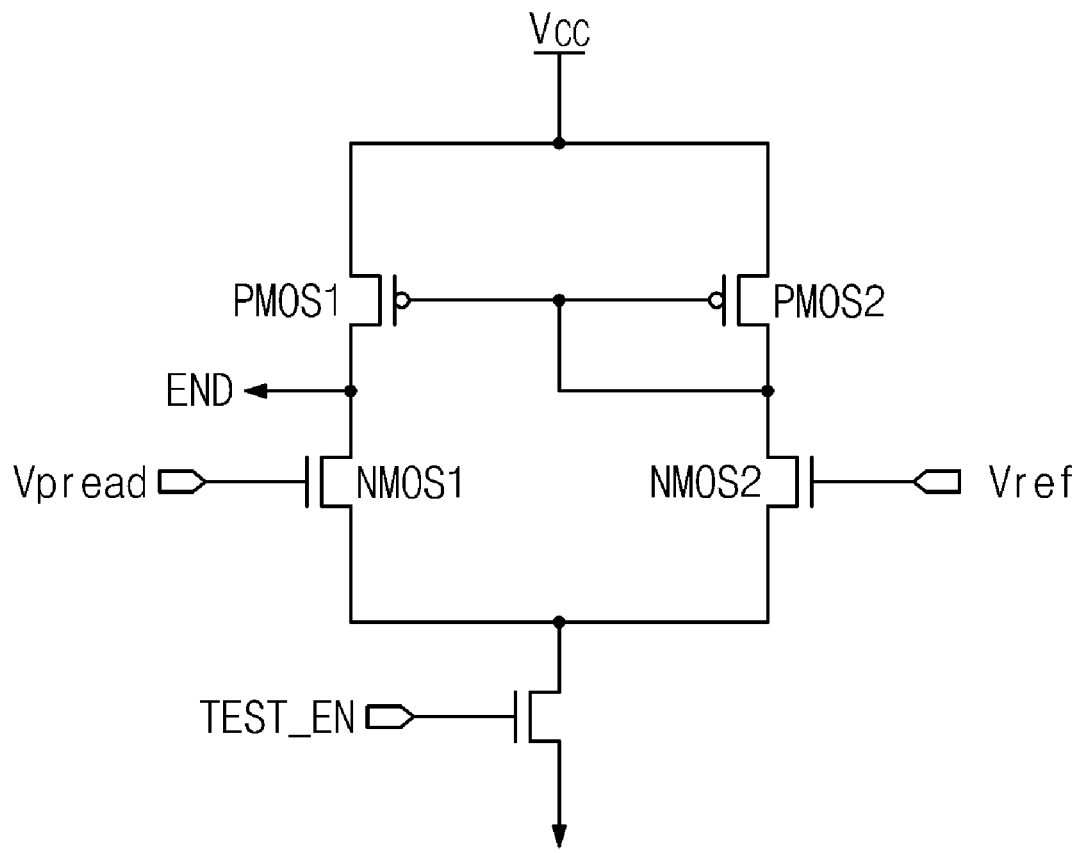
FIG. 3 is a circuit drawing further illustrating one possible structure for the comparator of FIG. 2.

FIG. 3 is a drawing illustrating a structure of a comparator illustrated in FIG. 2 by example.

Referring to the circuit diagram of FIG. 3, the comparator 33 of FIG. 1 is illustrated in some additional detail according to one possible example. In the illustrated example, the comparator 33 comprises PMOS transistors (PMOS1, PMOS2) and NMOS transistors (NMOS1, NMOS2, NMOS3).

The PMOS transistors (PMOS1, PMOS2) are connected in parallel between a power supply voltage (Vcc) and a ground voltage. Gates of the PMOS transistors (PMOS1, PMOS2) are connected to each other. Sources of the PMOS transistors (PMOS1, PMOS2) are connected to the power supply voltage (Vcc).

The NMOS transistors (NMOS1, NMOS2, NMOS3) are connected in parallel between a power supply voltage (Vcc) and a ground voltage.

A drain of the first PMOS transistor (PMOS1) is connected to a drain of the first NMOS transistor (NMOS1) and a drain of the second PMOS transistor (PMOS2) is connected to a drain of the second NMOS transistor (NMOS2).

A contact point between the gates of the PMOS transistors (PMOS1, PMOS2) is connected to a contact point between the drain of the second PMOS transistor (PMOS2) and the drain of the second NMOS transistor (NMOS2). The end signal (END) is generated from a contact point between the drain of the first PMOS transistor (PMOS1) and the first NMOS transistor (NMOS1).

The read voltage (Vpread) is applied to a gate of the first NMOS transistor (NMOS1) and the reference voltage (Vref) is applied to a gate of the second NMOS transistor (NMOS2). A source of the first NMOS transistor (NMOS1) and a source of the second NMOS transistor (NMOS2) are connected to a drain of the third NMOS transistor (NMOS3).

The test enable signal (TEST_EN) is applied to a gate of the third NMOS transistor (NMOS3). A source of the third NMOS transistor (NMOS3) is connected to the ground voltage.

The comparator 33 is driven by the power supply voltage (Vcc). The comparator 33 operates in response to the test enable signal (TEST_EN) provided from the pump controller 31.

The comparator 33 compares the read voltage (Vpread) with the reference voltage (Vref) and generates the timer ending signal (END) when the read voltage (Vpread) is lower than the reference voltage (Vref). An output end signal (END) is provided to the timer 35 as the end signal (END).

Figure 4:
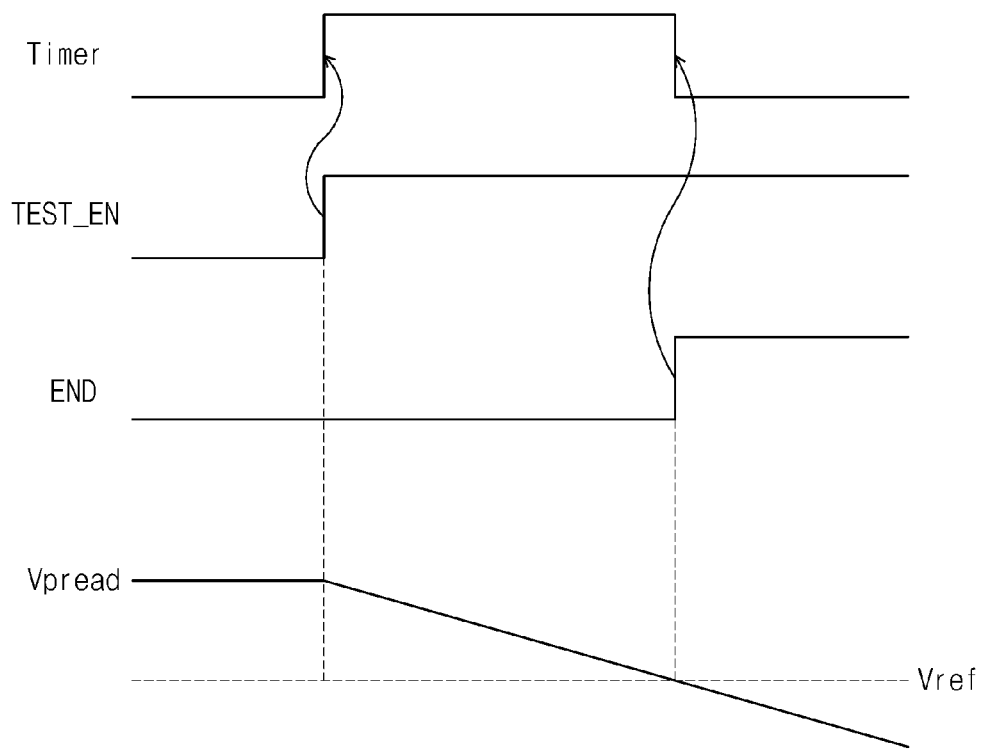
FIG. 4 is a timing diagram further illustrating operation of a semiconductor memory device in accordance with an embodiment of the inventive concept in a test mode.

FIG. 4 is a timing diagram illustrating a test mode for a semiconductor memory device in accordance with an embodiment of the inventive concept.

Before entering the test mode, a voltage pump circuit generates a high voltage to have a level of an active voltage. After that, when the test flag signal (TFS) is activated, the pump controller 31 provides the test enable signal (TEST_EN) to the comparator 33 in response to the standby enable signal (STB_EN). The comparator 33 operates in response to the test enable signal (TEST_EN).

If the test flag signal (TFS) is activated, the pump controller 31 controls the oscillator 21 so that the charge pump circuit 20 operates in standby mode. The pump controller 31 halts a provision of the clock enable signal (OSC_EN) for a charge pumping to the oscillator 21 in standby mode. Thus, the read voltage (Vpread) provided from the charge pump 23, as illustrated in FIG. 4, gradually decreases over time. The comparator 33 generates the end signal (END) when the read voltage (Vpread) falls below the level of the reference voltage (Vref).

Also, the timer 35 begins the count operation (or a time measurement) in response to the test enable signal (TEST_EN). Here, the test enable signal (TEST_EN) is the start signal (ST) indicating the operation of the timer 35. The timer 35 halts the time measurement in response to the end signal (END). The end signal (END) is generated when the read voltage (Vpread) falls below the level of the reference voltage (Vref).

A time value defining the time period of operation for the standby mode is thus provided by the timer 35 in accordance with the counting operation provided by the timer 35. This time value may be stored in the trim area of the memory cell array 11 to be set up the operation period for the standby mode.

Although the read voltage (Vpread) has been used to describe the foregoing embodiments of the inventive concept, the present inventive concept may be applied to other high voltages operating during the standby mode. Also, if a semiconductor memory device controls a standby operation for the read voltage (Vpread) using a time value, a read margin according to a read operation can be guaranteed.

Figure 5:
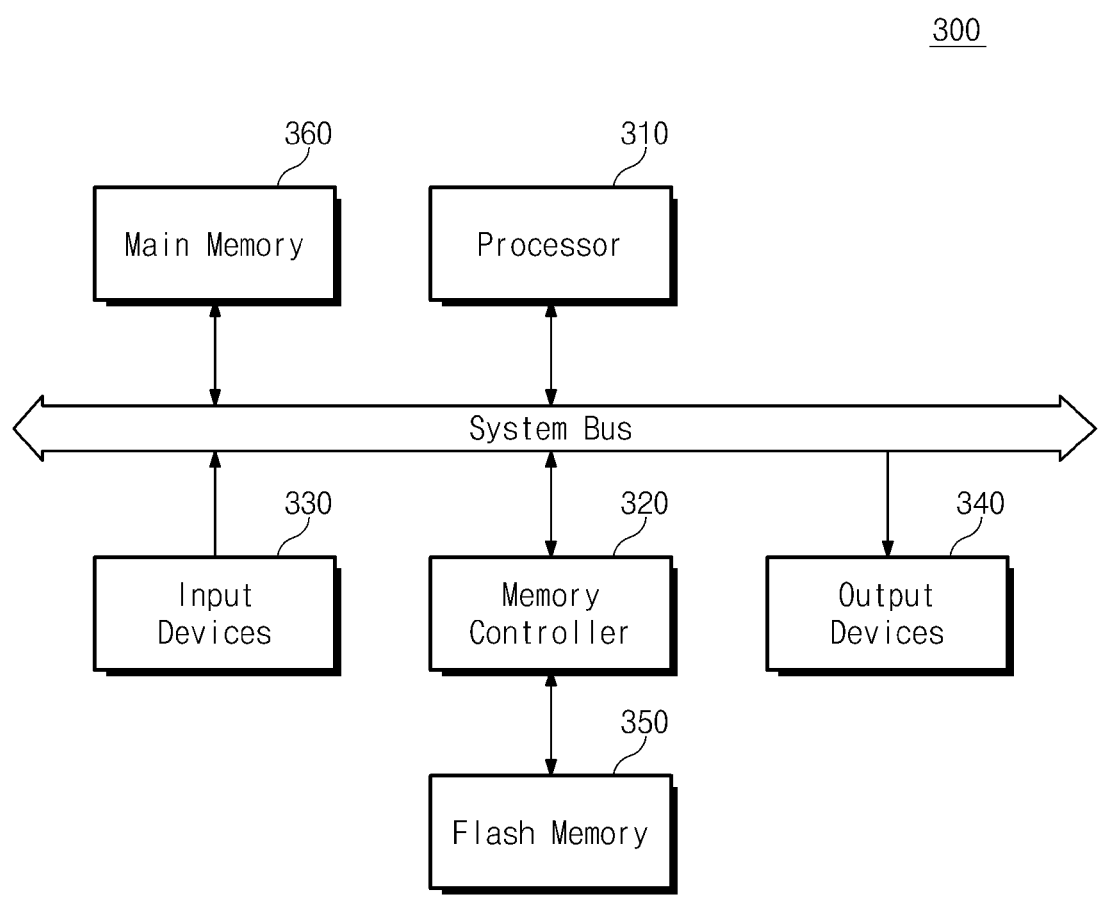
FIG. 5 is a general system diagram for a computational system including a semiconductor memory device in accordance with an embodiment of the inventive concept.

FIG. 5 is a general block diagram of a computational system 300 including a semiconductor memory device in accordance with an embodiment of the inventive concept.

Referring to FIG. 5, the computational system 300 comprises a processor 310, a memory controller 320, an input device 330, an output device 340, a memory 350 and a main memory device 360. Here, the memory may be a semiconductor memory device according to an embodiment of the inventive concept.

The memory controller 320 and the memory 350 may constitute a memory card. The processor 310, the input device 330, the output device 340 and the main memory device 360 may constitute a host using a memory card as a memory device.

The computational system 300 receives data from the outside through the input device (e.g., keyboard, camera) 330. The received data may be a command by a user or multi media data such as video data by a camera. The received data is stored in the flash memory 350 or in the main memory device 360.

The result processed by the processor 310 is stored in the flash memory 350 or the main memory device 360. The output device 340 outputs data stored in the flash memory 350 or the main memory device 360. The output device 340 outputs data as a type that a human can sense. For example, the output device 340 includes a display or a speaker.

A word line driving method in accordance with the present inventive concept is applied to the memory 350. As an operation speed of the memory 350 is improved, an operation speed of the computational system 300 will be improved in proportion to the improvement of the operation speed of the memory 350.

The memory 350 and/or the memory controller 320 may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Although not illustrated in the drawings, a power supply portion to supply a power supply needed to an operation of the computational system 300 may be required. In the case that the computational system 300 is a mobile device, a battery to supply an operation power supply of the computing system 300 is further required.

In FIG. 5, it is an example that the semiconductor memory device according to an embodiment of the inventive concept as applied to a general computational system. The semiconductor memory device described by the foregoing embodiments may be applied to various devices besides a mobile device. For example, the semiconductor memory device may be applied to a solid state drive (SSD), a mobile storage device such as MP3, a digital camera, PDA, e-Book, etc. Also, the semiconductor memory device may be used as a storage device such as a digital TV, a computer or the like.

According to various embodiments of the inventive concept, a semiconductor memory device controls the time period for a standby mode, such that the standby mode may be effectively controlled to avoid undue leakage current.

Although a few embodiments of the present inventive concept have been shown and described, it will be appreciated by those skilled in the art that changes may be made in these embodiments without departing from the principles of the inventive concept, the scope of which is defined in the appended claims and their equivalents. Therefore, the above-disclosed subject matter is to be considered illustrative, and not restrictive.

What is claimed is:

1. A semiconductor memory device comprising:
   a memory core comprising a trim circuit that stores trim information controlling at least one operation selected from a group of operations including a read operation, a write operation and an erase operations;
   a charge pump circuit configured to generate and provide a high voltage signal to the memory core during the at least one operation; and a charge pump control circuit configured to control operation of the charge pump circuit, wherein each of the charge pump circuit and charge pump control circuit are operable in a normal mode during which the at least one operation is executed and in a test mode during which trim information is generated, a combination of the charge pump circuit and the charge pump control circuit being configured during the normal mode to operate in one of an active operation during which the high voltage signal is provided to the memory core and a standby operation during which a level of the high voltage signal is maintained, the combination being further configured during the standby operation in the test mode to provide a time value, wherein the time value is saved as trim information controlling the charge pump control circuit in the generation of the high voltage signal during the standby operation in the normal mode.

2. The semiconductor memory device of claim 1, wherein the charge pump control circuit comprises:

a pump controller configured during the standby operation in the test mode to generate a start signal;

a comparator receiving a reference voltage and the high voltage signal during the standby operation in the test mode, and configured to generate an end signal when the high voltage signal falls below the reference voltage; and a timer that generates the time value in response to the start signal and the end signal.

3. The semiconductor memory device of claim 2, wherein the reference voltage is greater than a a standby voltage used during the standby operation to maintain the level of the high voltage signal during the normal mode.

4. The semiconductor memory device of claim 2, wherein the memory core comprises:

a memory cell array configured to store trim information;

a read/write circuit configured to read the trim information from the memory cell array upon power-up of the memory core, wherein upon power-up of the memory core the trim circuit receives a default time value stored as trim information and provides the default time value to the charge pump control circuit.

5. The semiconductor memory device of claim 4, further comprising:

an additional information offering unit configured to provide additional information to the charge pump control circuit to adjust the default time value, wherein the additional information comprises at least one of power supply voltage information and temperature information.

6. The semiconductor memory device of claim 5, wherein the additional information offering unit comprises a temperature sensor configured to generate the temperature information by detecting an operating temperature for the semiconductor memory device.

7. The semiconductor memory device of claim 2, wherein the high voltage signal is a read voltage.

8. The semiconductor memory device of claim 1, wherein the charge pump circuit comprises:

a charge pump that provides the high voltage signal: and an oscillator that controls operation of the charge pump.

9. A computational system, comprising:

a memory controller controlling a semiconductor memory device, wherein the semiconductor memory device comprises:

a memory core comprising a trim circuit that stores trim information controlling at least one operation selected from a group of operations including a read operation, a write operation and an erase operations;

a charge pump circuit configured to generate and provide a high voltage signal to the memory core during the at least one operation; and a charge pump control circuit configured to control operation of the charge pump circuit, wherein each of the charge pump circuit and charge pump control circuit are operable in a normal mode during which the at least one operation is executed and in a test mode during which trim information is generated, a combination of the charge pump circuit and the charge pump control circuit being configured during the normal mode to operate in one of an active operation during which the high voltage signal is provided to the memory core and a standby operation during which a level of the high voltage signal is maintained, the combination being further configured during the standby operation in the test mode to provide a time value, wherein the time value is saved as trim information controlling the charge pump control circuit in the generation of the high voltage signal during the standby operation in the normal mode.

10. The computational system of claim 9, wherein the charge pump control circuit comprises:

a pump controller configured during the standby operation in the test mode to generate a start signal;

a comparator receiving a reference voltage and the high voltage signal during the standby operation in the test mode, and configured to generate an end signal when the high voltage signal falls below the reference voltage; and a timer that generates the time value in response to the start signal and the end signal.

11. The computational system of claim 10, wherein the reference voltage is greater than a standby voltage used during the standby operation to maintain the level of the high voltage signal in the normal-mode.

12. The computational system of claim 10, wherein the memory core comprises:

a memory cell array configured to store trim information;

a read/write circuit configured to read the trim information from the memory cell array upon power-up of the memory core, wherein upon power-up of the memory core the trim circuit receives a default time value stored as trim information and provides the default time value to the charge pump control circuit.

13. The computational system of claim 12, further comprising:

an additional information offering unit configured to provide additional information to the charge pump control circuit to adjust the default time value, wherein the additional information comprises at least one of power supply voltage information and temperature information.

14. The computational system of claim 13, wherein the additional information offering unit comprises a temperature sensor configured to generate the temperature information by detecting an operating temperature for the semiconductor memory device.

15. The computational system of claim 10, wherein the high voltage signal is a read voltage.

* * * * *